(12) United States Patent
Alaca et al.

(10) Patent No.: US 9,413,333 B2
(45) Date of Patent: Aug. 9, 2016

(54) NANOMECHANICAL RESONATOR ARRAY AND PRODUCTION METHOD THEREOF

(71) Applicant: Koc Universitesi, Sariyer, Istanbul (TR)

(72) Inventors: Burhanettin Erdem Alaca, Istanbul (TR); Yusuf Leblebici, Lutry (CH); Ismail Yorulmaz, Istanbul (TR); Yasin Kilinc, Ankara (TR); Bekir Aksoy, Istanbul (TR)

(73) Assignee: Koc Universitesi, Istanbul (TR)

( * ) Notice: Subject to any disclaimer, the term of this patent is extended or adjusted under 35 U.S.C. 154(b) by 0 days.

(21) Appl. No.: 14/785,535

(22) PCT Filed: Apr. 19, 2013

(86) PCT No.: PCT/EP2013/058133
§ 371 (c)(1),
(2) Date: Oct. 19, 2015

(87) PCT Pub. No.: WO2014/169960
PCT Pub. Date: Oct. 23, 2014

(65) Prior Publication Data
US 2016/0087600 A1  Mar. 24, 2016

(51) Int. Cl.
*H03H 9/24* (2006.01)
*B82B 1/00* (2006.01)
(Continued)

(52) U.S. Cl.
CPC .............. *H03H 9/2463* (2013.01); *B82B 1/005* (2013.01); *H03B 5/30* (2013.01); *H03H 9/2405* (2013.01);
(Continued)

(58) Field of Classification Search
CPC ...... H03H 9/2463; B82B 1/005; B82B 1/008; Y19S 977/762; Y19S 977/956
USPC .......................................... 331/158, 159, 162
See application file for complete search history.

(56) References Cited

U.S. PATENT DOCUMENTS 6,236,281 B1   5/2001  Nguyen et al.
6,930,569 B2   8/2005  Hsu
(Continued)

FOREIGN PATENT DOCUMENTS

WO   WO 2008/036830 A2   3/2008

OTHER PUBLICATIONS

International Preliminary Report on Patentability (PCT Article 36 and Rule 70), dated Mar. 25, 2015, pp. 1-13, issued in International Application No. PCT/EP2013/058133, European Patent Office, Rijswijk, The Netherlands.
(Continued)

*Primary Examiner* — Jeffrey Shin
(74) *Attorney, Agent, or Firm* — Brinks Gilson & Lione

(57) ABSTRACT

In the present invention, a nanomechanical resonator array (1), which is suitable being used in an oscillator and production method of said nanomechanical resonator array are developed. Said resonator array (1) comprises at least two resonators (2), which are in the size of nanometers, which are vertically arrayed and which are preferably in the form of nano-wire or nano-tube; at least one coupling membrane (3), which mechanically couples said resonators (2) from their one ends, and at least one clamping element (4), which supports mechanical coupling by clamping said coupling membrane (3). Said resonator array (1) can be actuated and its displacements can be sensed. The present invention develops a predictive model of the frequency response of an oscillator comprising the said resonator array (1) for electrostatic actuation and capacitive readout. An oscillator comprised of multiple resonator arrays (1) with different frequency responses connected to a frequency manipulation circuitry can be used as well. For silicon-based systems, said production method comprises the steps of patterning two windows on device silicon layer exposing it to plasma etching using Bosch process; carrying out a further oxidation to form nanowires in an oxide envelop; depositing further sacrificial material. Actuation and readout electrode integration comprises steps of electrode material deposition; self-aligned mask material deposition, chemical mechanical polishing; electrode material etch; releasing nanowires by etching sacrificial material and oxide envelope. For non-silicon-based systems, said production method comprises the steps of structural and sacrificial material deposition; patterning and anisotropic etching of both materials; isotropic etching of sacrificial material.

16 Claims, 6 Drawing Sheets

(51) Int. Cl.
*H03B 5/30* (2006.01)
*H03H 9/02* (2006.01)
*B82Y 15/00* (2011.01)
*B82Y 40/00* (2011.01)

(52) U.S. Cl.
CPC *B82Y 15/00* (2013.01); *B82Y 40/00* (2013.01); *H03H 2009/02291* (2013.01); *Y10S 977/762* (2013.01); *Y10S 977/888* (2013.01); *Y10S 977/956* (2013.01)

(56) References Cited

U.S. PATENT DOCUMENTS

| | | |
|---|---|---|
| 7,227,432 B2 | 6/2007 | Lutz et al. |
| 7,295,088 B2 | 11/2007 | Nguyen et al. |
| 7,319,372 B2 | 1/2008 | Pan et al. |
| 7,382,205 B2 * | 6/2008 | Van Beek ............. H03H 3/0072 310/309 |
| 7,696,843 B2 | 4/2010 | Hashimura |
| 2009/0219114 A1 | 9/2009 | Kaunisto et al. |
| 2010/0141355 A1 | 6/2010 | Kharrat et al. |
| 2014/0320219 A1 * | 10/2014 | Kenig ...................... H03H 1/00 331/35 |

OTHER PUBLICATIONS

International Search Report and Written Opinion of the International Searching Authority, dated Dec. 17, 2013, pp. 1-8, issued in International Application No. PCT/EP2013/058133, European Patent Office, Rijswijk, The Netherlands.

Evren F. Arkan et al., "Monolithic Integration of Si Nanowires with Metallic Electrodes: NEMS Resonator and Switch Applications," Nov. 22, 2011, IOP Publishing Ltd., Journal of Micromechanics and Microengineering, vol. 21, No. 12.

* cited by examiner

NANOMECHANICAL RESONATOR ARRAY AND PRODUCTION METHOD THEREOF

This application is a national stage entry application under 35 U.S.C. §371 of and claims priority under 35 U.S.C. §119 (e) to PCT Patent Application Serial Number PCT/EP2013/058133 filed Apr. 19, 2013, which is incorporated by reference.

FIELD OF INVENTION

The present invention relates to nanomechanical resonator arrays, which are suitable being used in oscillator systems, and production methods of said resonator arrays.

PRIOR ART

Oscillators serving as frequency references form the basis of almost all electronic devices. There are three major types of oscillators:

Silicon clock or CMOS oscillator is the all-electronic version, where a resonant circuit provides the frequency reference. These integrated circuit oscillators are based on classical RC or LC oscillator-based circuits. Due to their Si compatibility they are widely used in applications where size and price are important factors and frequency sensitivity is less of a concern. With on-chip temperature compensation state-of-the-art sensitivities around 100 ppm are reported. They are immune to shock. Their power consumption is higher compared to quartz counterparts and they have lower quality factors.

Mechanical oscillators form an alternative to the integrated circuit oscillator. Major types of mechanical oscillators include quartz or other piezoelectric crystals. According to patent document U.S. Pat. No. 7,295,088B2, the current high-Q resonators are surface acoustic wave (SAW), film bulk acoustic wave (FBAR) resonators and quartz tuning forks which are all electromechanical elements converting mechanical energy into electrical energy and hence generate signals with desired frequency or filtering characteristics. The ultimate choice of materials is based on cost and application-dependent performance requirements.

Quartz provides the best performance in terms of stability at highest cost. Quartz crystal has been used for timekeeping purposes since early 1940s. Quartz is used today for high-precision applications such as wireless communication due to its high thermal stability and low power dissipation.

However, such crystal oscillators come in relatively large sizes leaving little room for miniaturization. Furthermore, their processing and integration with other microsystems or electronics is not batch-compatible leading to another and even more serious barrier to miniaturization. The latter means extra board-level integration with additional electronics to implement the desired use. The usage of such extra electronics increases the overall cost in addition to power consumption as well as the noise level.

MEMS oscillators form the third alternative. They are in the market for more than a decade. The vendors currently supplying MEMS oscillator include Abracon, Discera, Ecliptek, IDT, IQD, NXP, Sand9, Silicon Labs, SiTime, TXC Corporation. They are based on a miniature resonating mass made up of usually silicon or a similar material. Due to the possibility of batch compatibility and use of conventional microfabrication they facilitate miniaturization and a high level of integration. In the Hsu, W T; "Recent Progress in silicon MEMS oscillators" 40$^{th}$ Annual Precise Time and Time Interval (PTTI) Meeting, Virgina, USA, pp. 135-145, 2008, quality factors beyond $10^6$ are already reported.

Since the resonator is miniaturized, the damping of air molecules becomes severe, and the necessity of hermetic sealing arises in order to reduce this damping. Another current issue is temperature instability which is compensated with on-chip digital tuning. This tuning also leads to the phase noise of the oscillator.

One of the most promising applications of MEMS oscillators is in filtering. MEMS filters are basically mechanical resonators in which the signal is engineered by using various mechanical (acoustic) coupling elements. Early macroscopic mechanical filters can be modeled by equivalent circuit modeling methods. The mechanical coupling in these macroscopic resonators is achieved through coupling wires with diameters changing between 2-3 mm. The same approach for equivalent circuit modeling is adopted in their current MEMS counterparts. Equivalent circuit modeling provides successful design of desired filter element. (Butterworth, Chebyshev, etc.) Once the equivalent circuit is obtained, it is possible to observe the signaling behavior of the electromechanical element. The ability to predefine the mode of operation of coupled oscillators makes them ideal candidates for replacing other kinds of electrical filters.

In oscillator applications with capacitive readout, arraying identical resonators to sum the currents associated with the motion of individual resonators is suggested as an alternative to other methods for the reduction of motional impedance such as the reduction of electrode-to-resonator gap, and raising the DC potential applied on the resonator. Although the latter two are very effective techniques, they introduce non-linearity. On the contrary, the method of using an array and superposing the outputs of parallel resonators works well in terms of linearity. The following MEMS filter applications utilize such coupling:

One of the first MEMS filters is realized with comb drive architecture with three mechanically coupled resonators operating at 300 kHz with Q=590. The design and coupling mechanisms are studied along with equivalent circuit modeling methods with comb drive architecture until early 2000. Having similar mechanical filter design methods with previous macroscopic devices helped much to realize MEMS filters with desired characteristics. CTC Nguyen and RT Howe patented this comb drive architecture in 2001 (U.S. Pat. No. 6,236,281B1).

Filter frequencies around 8 MHz and Q factors between 40 and 450 are demonstrated in a configuration with two mechanically coupled doubly clamped beam resonators. This study also utilizes the above mentioned filter design method utilizing finite element analysis and circuit modeling. Since flexural beam resonators provide higher frequencies than the comb drive transducers, beam resonators are studied in various applications: mixer-filters, coupled free-free beam resonator arrays with five, ten and twenty resonators for improved phase noise and resonators with different coupling lengths and schemes for engineering the filter output signal. One U.S. Pat. No. 6,930,569B2 comprising coupled beam structure is filed in 2005.

A rather different architecture utilizing coupled square flexural-mode microresonators is announced in 2005. In a study seven coupled square flexural-mode microresonators are utilized at 70 MHz with Q in excess of 9000. In 2006 disk array rather than square microresonators are implemented. Doubly clamped and cantilever beams with various V-shaped coupling elements are studied with above mentioned conventional design methods. The same lateral filter with U-shaped coupling element is demonstrated with 26 MHz operation frequency. A patent document (U.S. Pat. No. 7,295,088B2) is filed containing design and fabrication of coupled hollow disk resonators. In another study, enhancement of Q factor by arraying of wine-glass-disk resonators is demonstrated. This study offered a hybrid use of low impedance piezoelectric transducers with high Q capacitive transducers by mechanical coupling. Another U.S. Pat. No. 7,227,432B2 is filed on different mechanically coupled resonator geometries such as rings with bending and breathing mode in triangle, square, hexagon shapes.

In 2009, it is shown that the use of mechanically coupled arrays reduces device-to-device resonance frequency variation and hence allows batch fabrication of microresonators.

Other current patent filings (such as U.S. Pat. No. 7,319, 372B2, US2010141355A1 and U.S. Pat. No. 7,696,843B2) include coupled MEMS tuning forks, N-coupled microresonators as bandpass filters, and a nanoscale coupling element with very low mass for MEMS filter devices in order to prevent mass loading effects.

The drive towards smaller mechanical resonators is fueled by a pursuit of higher frequencies at reduced noise levels. Hence, nanoelectromechanical system (NEMS)-based resonators represent the next stage of evolution with operation frequencies in extreme UHF and microwave band. High motional impedance remains a challenge at the nanoscale. As the size of the mechanical resonator shrinks, involved displacements even at resonance become minute, and the motional impedance increases significantly. This makes motion-dependent readout signal is very difficult to detect. Some solutions such as arraying and mechanical coupling provided by past electromechanical filter and other electromechanical frequency engineering applications can inspire further progress in nanoscale resonators. Currently no solutions exist at the nanoscale for both mechanical coupling and arraying of individual resonators.

BRIEF DESCRIPTION OF INVENTION

In the present invention, a nanomechanical resonator array, which is suitable being used in an oscillator and production method of said resonator array are developed. Said resonator array comprises at least two resonators, which are in the size of nanometers, which are vertically arrayed and which are preferably in the form of nano-wire or nano-tube; at least one coupling membrane, which mechanically couples said resonators from their one ends, and at least one clamping element, which supports mechanical coupling by clamping said coupling membrane. For full electronic compatibility, said nanomechanical resonator array can be placed between a pair of electrodes, one for actuation and one for readout. For silicon-based systems said production method comprises the steps of using Bosch process to fabricate a stack of silicon nanowires; achieving an array fabrication through patterning two windows on device silicon layer exposing it to plasma etching, where each cycle of Bosch process leads to one silicon line; carrying out a further oxidation to form nanowires from silicon lines in an oxide envelop; releasing nanowires by etching the oxide envelope. Said production method for silicon nanowires can also be adjusted to yield a stack of nanowires without oxidation and sacrificial oxide etch. For non-silicon-based systems said production method comprises the steps of consecutive deposition of two materials, one structural and one sacrificial; patterning and anisotropic etching of two materials; isotropic, selective etching of sacrificial material to yield an array of nanowires made of the structural material. Said production method also comprises the steps of oxide or similar material deposition, electrode material deposition, electrode material patterning and etch, and oxide or similar material etch to release nanowires, which are positioned very close to a pair of electrodes on both sides of nanowire array.

According to the present invention, resonator array may be coupled to each other or not coupled at all. Therefore, according to the resonator selection either motional impedance of the resonator array is decreased and quality factors increase (such as a notch filter) or at least two signals with different frequencies are able to pass the resonator array (such as a band-pass filter).

OBJECT OF INVENTION

The object of the present invention is to develop a mechanical resonator array, which comprises more than one resonator in the size of nanometers.

Another objective of the present invention is to produce the array so that it is positioned perpendicular to the surface of the substrate that holds the array.

Another object of the present invention is to develop mechanical coupling of nanoscale electromechanical resonators in order to obtain a composite resonator.

Another object of the present invention is to implement actuation and readout schemes for the mechanical resonator array to ensure full electronic compatibility.

Another object of the present invention is to develop a production method for a mechanical resonator array, which comprises more than one mechanical resonator with mechanical coupling in between in the size of nanometers.

Another object of the present invention is to develop a production method for the integration of a mechanical resonator array with a pair of electrodes, one for actuation and one for readout.

Another object of the invention is to demonstrate a predictive electromechanical modelling method of the readout signal measured on the mechanical resonator array with mechanical coupling.

Another object of the present invention is to employ the mechanical resonator array with or without mechanical coupling for high frequency engineering applications such as filters.

Another object of the present invention is to introduce a number of such mechanical resonator arrays with their own frequency signature, leading to a wide selection of frequencies in an ultra-small area on the chip.

Another object of the present invention is to connect a number of mechanical resonator arrays built within the same chip to frequency manipulation circuitry on the same chip.

DESCRIPTION OF FIGURES

Illustrative embodiments of the resonator array and production method of said resonator array developed according to the present invention are illustrated in annexed figures briefly described hereunder.

Figure 1:
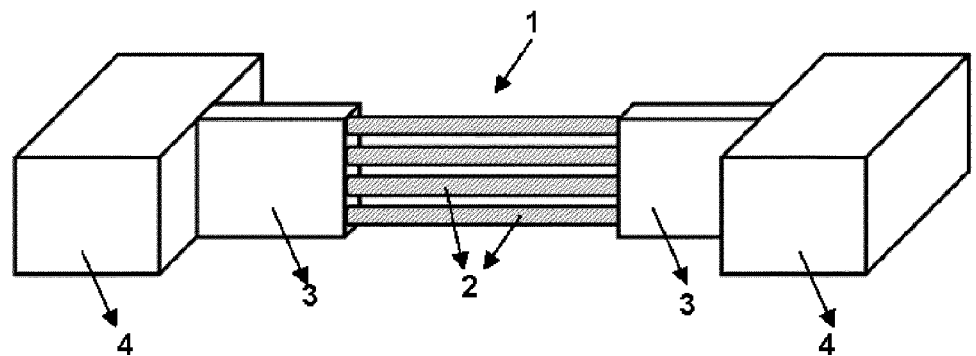
FIG. 1 is a perspective view of resonator array.

The components in said figures are individually referenced as following;
Resonator array (1)
Resonator (2)
Coupling membrane (3)
Clamping element (4)
Actuating electrode (5)
Readout electrode (6)
Resonator capacitance (C)
Resonator resistance (R)
Resonator inductance (L)
Electromechanical transduction inductance for actuation ($L_a$)
Electromechanical transduction inductance for readout ($L_r$)
Coupling element inductance ($L_c$)
Coupling element capacitance ($C_c$)
Input resistance ($R_{Drive}$)
Output resistance ($R_{Load}$)
Actuation voltage ($V_{AC}$)
Electrode-to-electrode (feedthrough) capacitance ($C_f$)
Electrode-to-resonator capacitance ($C_0$)
Parasitic capacitance ($C_p$)
First mode frequency ($f_0$)
Finite element analysis (FEA)
Numerical computation tool (NCT)
Circuit simulation program (CSP)
Circuit representation of resonator (RES)
Circuit representation of actuation transduction (ACT)
Circuit representation of readout transduction (RO)
Circuit representation of coupling (CP)
Mask (M)
Silicon (Si)
Etch stop (E)
Oxide (O)
First sacrificial material (S1)
Second sacrificial material (S2)
Structural material (N)
Electrode material (C)
Self-aligned mask material (D)
Electrode integration (P)

DESCRIPTION OF INVENTION

The problem of high motional impedance can be addressed by using an array configuration of nanomechanical resonators, where the output signal will increase almost proportional to the number of involved nanomechanical resonators. By employing an array configuration, the level of this signal can be increased, simply because one increases the number of resonators contributing to the motional current. Although this seems straightforward, fabricating two identical resonators with negligible variation in dimensions is a difficult task even with cutting-edge fabrication technologies. The resulting resonator-to-resonator variation disturbs the output as out-of-phase resonance modes become dominant. At this point mechanical coupling becomes critical as it provides a means of fabricating a composite resonator—not an array of uncoupled, individual resonators—with its own set of natural modes. If the mode where all resonator elements oscillate in phase can be picked up, the desired increase in output signal can be achieved. For example, a deviation from 28 nm to 30 nm in diameter of two otherwise identical double-clamped nanowires would result in a 7% deviation in resonance frequency leading to a significant decoupling of vibration modes. Furthermore, various frequency engineering applications such as filters necessitate multi-resonator configurations (with or without mechanical coupling) turning mechanical resonator array into an ideal building block for such applications. For example, if no coupling is used, one can obtain from an array of at least two resonators two distinct frequencies, which—if they are close enough—can form a band pass filter.

Figure 2:
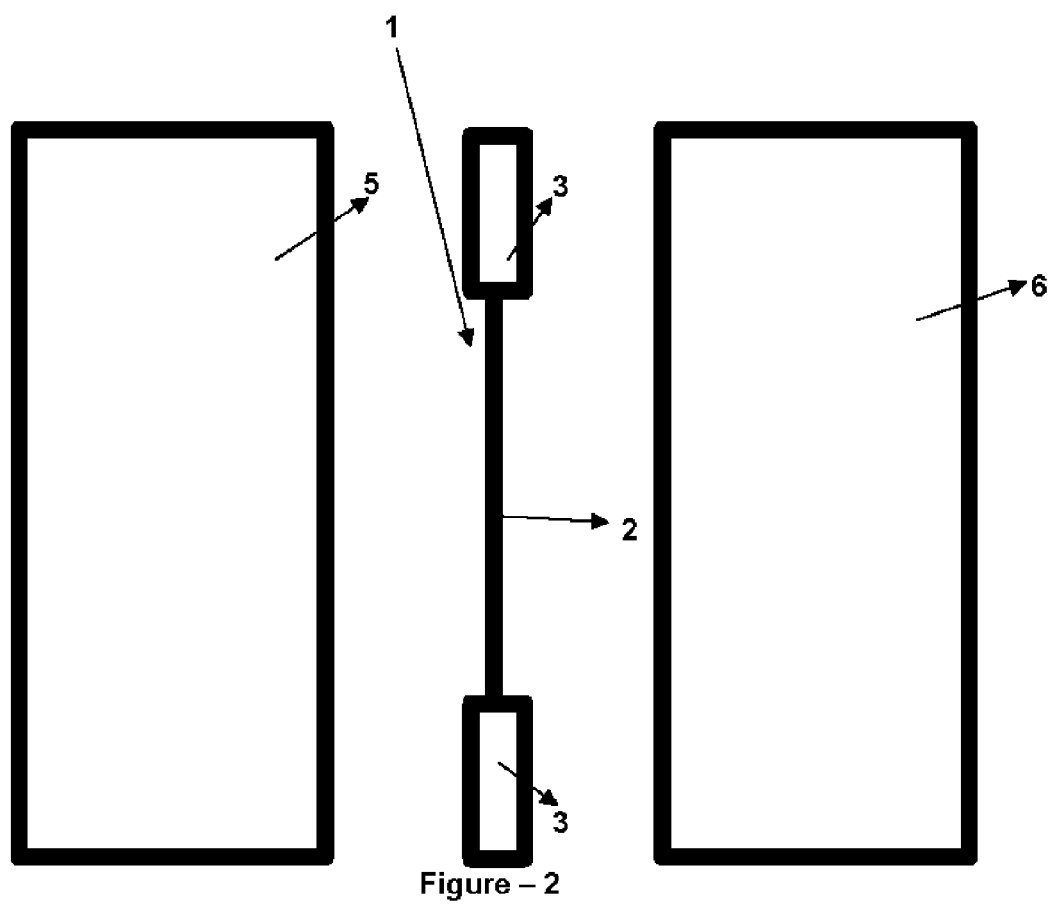
FIG. 2 is top view of an oscillator, in which a nanomechanical resonator array is used.

The solution for the decoupling of the vibration modes due to fabrication-based limitations is best solved by mechanical coupling. In this invention mechanical coupling is achieved through the use membrane-type coupling elements in a vertical array of one-dimensional nanomechanical resonators as depicted in FIG. 1 for the case of double-clamped nanomechanical resonators. FIG. 2 provides a top-view of the same array surrounded by an actuation electrode (5) and a readout electrode (6). If this array (1) is placed near a readout electrode (6), displacements of nanomechanical resonators (2) can directly be transduced as a readout current. For an array of four nanomechanical resonators (1), among all involved vibration modes the first mode provides in-phase vibration for all nanomechanical resonators involved. This leads to a significant increase in the readout signal thanks to the increase in capacitance change due to the vibrating bodies.

Resonator array (1) of the present invention comprises at least two resonators (2), which are in the size of nanometers, which are vertically arrayed and which are preferably in the form of nano-wire or nano-tube; at least one coupling membrane (3), which mechanically couples said resonators (2) from their one ends, and at least one clamping element (4), which supports mechanical coupling by clamping said coupling membrane (3). Thanks to the coupling membrane (3) and clamping element (4), mechanical coupling of said resonators (2) becomes more stable and therefore resonator array (1) works like a composite resonator. Furthermore, since resonators (2) are in size of nanometers and since resonators (2) are arrayed vertically, resonator array (1) and an oscillator, in which said resonator array (1) is used, occupies less space in a circuit. Due to the smallness of the resonator array (1) one can use multiple arrays with their own frequency signature, leading to a wide selection of frequencies in an ultra-small area on the chip. Each of such arrays can as well be connected to other frequency manipulation circuitry on the same chip.

In an exemplary embodiment, which is shown in FIG. 2, of the present invention, said resonator array (1) is placed between at least one actuator (for example an actuating electrode (5), a magnetic actuator or a thermal actuator) and at least one readout electrode (6) in an oscillator system. In this embodiment, electrical field created by actuating electrode (5) vibrates the resonators (2) placed in the resonator array (1) and therefore a signal with a frequency is outputted from readout electrode (6).

In a preferred embodiment of the present invention, each resonator (2) of the resonator array (1) are identical (or nearly identical, due to fabrication). In this embodiment, since resonators (2) are identical, resonance frequency of all the resonators (2) are same. Thus, when the resonators (2) are vibrated by an actuating electrode (5), motional currents of all resonators (2) are summed up in the readout electrode (6) and current of the output signal increases. In other words, motional impedance of the resonator array (1) is decreased.

In another preferred embodiment of the present invention, at least two resonators (2) of the resonator array (1) are non-identical. In this embodiment, resonating frequencies of at least two resonators (2) are different from each other. Thus, when resonator array (1) is actuated by an actuating electrode (5), at least two different signals are able to be outputted from readout electrode (6). In other words, at least two signals with different frequencies are able to pass the resonator array (1). In this embodiment, resonator array (1) is used as a band pass filter.

In another preferred embodiment of the present invention, at least two resonators (2) of the resonator array (1) are non-identical and coupled through the coupling membrane (3). In this embodiment, although resonating frequencies of at least two resonators (2) are different from each other, resonator array acts as a single, composite resonator with well defined vibration modes.

In another preferred embodiment of the present invention, resonator array (1) with non-identical resonators (2) and with coupling membrane (3) is actuated by an actuating electrode (5). When the first mode is sufficiently far from other modes, one single frequency is to be outputted from readout electrode (6). In this embodiment, resonator array (1) is used as a notch filter.

In another preferred embodiment of the present invention, resonator array (1) with non-identical resonators (2) and with coupling membrane (3) is actuated by an actuating electrode (5). When vibration modes are close to each other, a frequency range is to be outputted from readout electrode (6). In this embodiment, resonator array (1) is used as a band pass filter.

In another preferred embodiment of the present invention, at least two resonators (2) of the resonator array (1) are actuated by a nearby actuation electrode (5). Readout is carried out by optical detector such as Doppler vibrometer, interferometer or position sensitive detector.

In another preferred embodiment of the present invention, Lorentz force is used for actuation, where a current is passed through the resonators (2) of the resonator array (1) and the resonator array (1) is placed in an external magnetic field. Readout is carried out capacitively by the nearby electrode (6).

In another preferred embodiment of the present invention, Lorentz force is used for actuation, where a current is passed through the resonators (2) of the resonator array (1) and the resonator array (1) is placed in an external magnetic field. Readout is carried out by an optical detector such as Doppler vibrometer, interferometer or position sensitive detector.

In another preferred embodiment of the present invention, thermal actuation is used through an external heating mechanism of the resonators (2) in the resonator array (1). Readout is carried out capacitively by the nearby electrode (6) or an optical detector such as Doppler vibrometer, interferometer or position sensitive detector.

Figure 3:
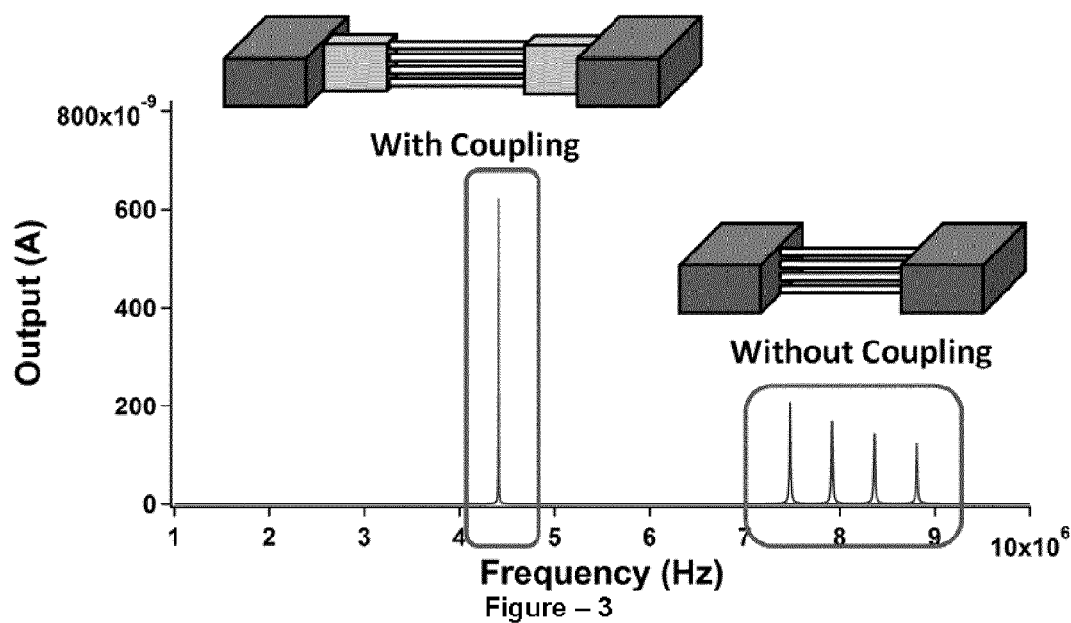
FIG. 3 is a comparison of the behaviour of an oscillator with coupled and uncoupled array of nanomechanical resonators.

FIG. 3 illustrates the effect of dimensional variations, where four nanomechanical resonators (2) of the resonator array (1) of FIG. 1 have a length of 10 μm and diameters ranging from 85 nm to 100 nm. In the absence of any coupling the resulting resonance behavior exhibits a frequency spectrum reflecting individual modes of these non-identical resonators measured as an output current from electrode (6). This decoupling results in lower readout signal levels, because at any time only a limited number of involved nanomechanical resonators contribute to the readout current. On the contrary, if these four non-identical nanomechanical resonators (2) of the resonator array (1) are coupled through membrane supports (3) at both ends of the resonators (2) as shown in FIG. 1, a completely different resonance behavior is obtained. FIG. 3 shows that a mode where all nanowire resonators (2) of the resonator array (1) vibrate in phase is obtained at a lower frequency. Resonator array (1) acts in this case as a composite resonator with a well-defined first-mode resonance frequency. Furthermore, the signal level at readout electrode (6) increases almost three-fold. A 130-nm-thick support membrane (3) geometry is used with a length of 5.0 μm and a depth of 1.6 μm.

Figure 4:
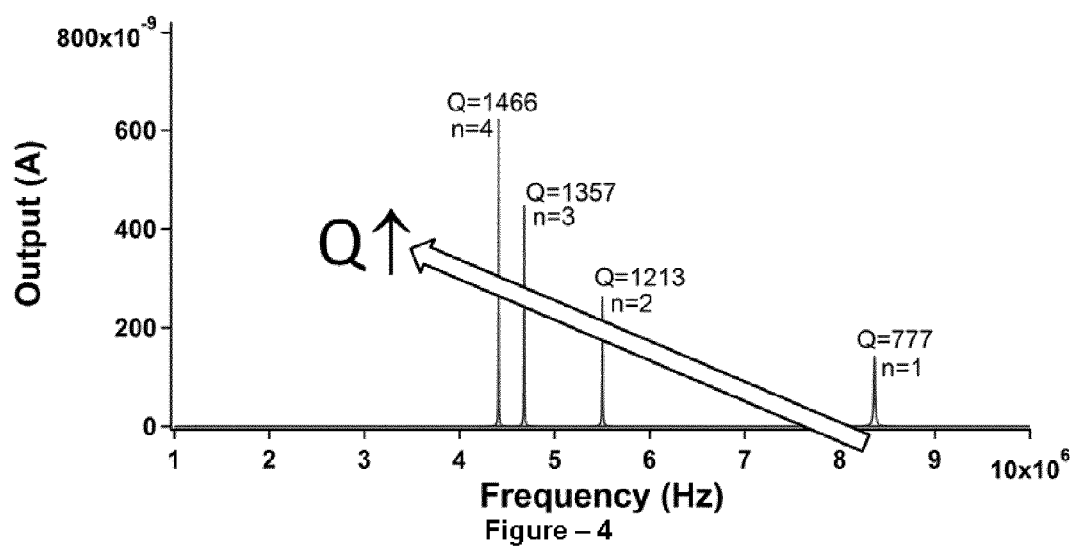
FIG. 4 is a comparison of the behaviour of an oscillator with a coupled nanomechanical resonator array as a function of the number of involved nanomechanical resonators.

FIG. 4 shows the effect of the number (n) of involved nanomechanical resonators (2) on the magnitude of the output signal from readout electrode (6). Hence, with the number of involved mechanical resonators (2) increasing, frequency decreases due to increasing mass and output signal increases in accordance with expectations. What is more important is the increase in the quality factor as the number of involved nanomechanical resonators increase turning the configuration into an ideal notch filter, one among many frequency engineering applications such as band-pass filters and frequency mixers.

Furthermore, in the plane of the substrate real estate remains the same, since the overall area of the oscillator would not change with the number of nanomechanical resonators (2) within the resonator array (1). In this approach the number of nanomechanical resonators (2) is limited by the diameter of and distance between the nanomechanical resonators (2) and thickness of the device layer, in which nanomechanical resonators (2) are placed.

In another preferred embodiment of the present invention, a certain number of resonator arrays (1) are fabricated within an ultra-small area on a chip, where each array (1) with its own signature, gives rise to a variety of frequency selection.

In another preferred embodiment of the present invention, a number of resonator arrays (1) fabricated within an ultra-small area on a chip are connected to frequency manipulation circuitry placed on the same chip.

Figure 5:
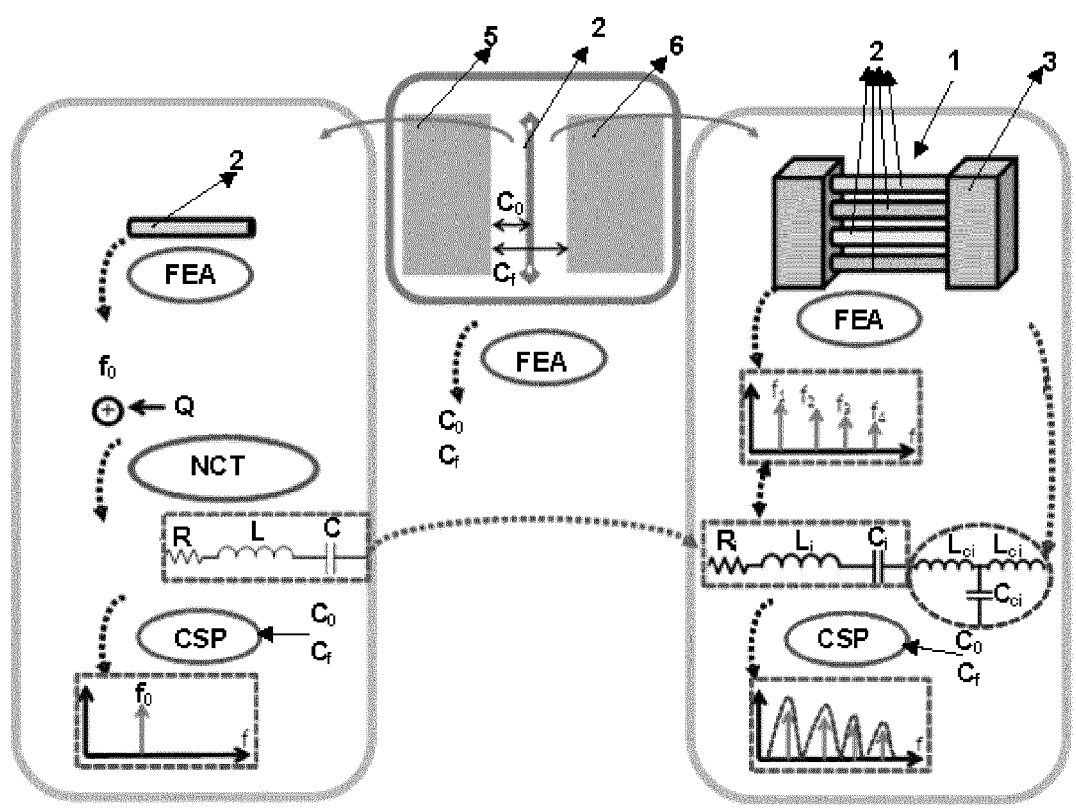
FIG. 5 is the predictive modelling procedure for the oscillator behaviour.

The corresponding electrical modeling procedure of the nanomechanical resonator array (1) is shown in FIG. 5. In the left column of FIG. 5, modeling for a single nanomechanical resonator (2) is depicted. Double-clamped single nanomechanical resonator (2) is modeled using analytical techniques or a finite element analysis (FEA) program. The first mode frequency, $f_0$, thus obtained from FEA modeling is used along with Q factor and other layout parameters to calculate electrical equivalent R, L, C values of the flexural-mode single nanomechanical resonator (2) by a numerical computation tool (NCT). (Calculations are based on the formulation developed in Johnson, R A, "Mechanical Filters in Electronics", John Wiley & Sons, New York, 1983. and Bannon III, F. D., Clark, J. R. and Nguyen, C. T.-C., "High frequency micromechanical filters," IEEE J. Solid-State Circuits, vol. 35, no. 4, pp. 512-526, 2000) An equivalent electrical circuit of the whole system is simulated using a circuit simulation program (CSP) and incorporating an electrode-to-electrode (feedthrough) capacitance ($C_f$), and electrode-to-resonator capacitance ($C_0$) computed by an FEA program. This results in the signal level of the single nanomechanical resonator (2) at its first mode.

Figure 6:
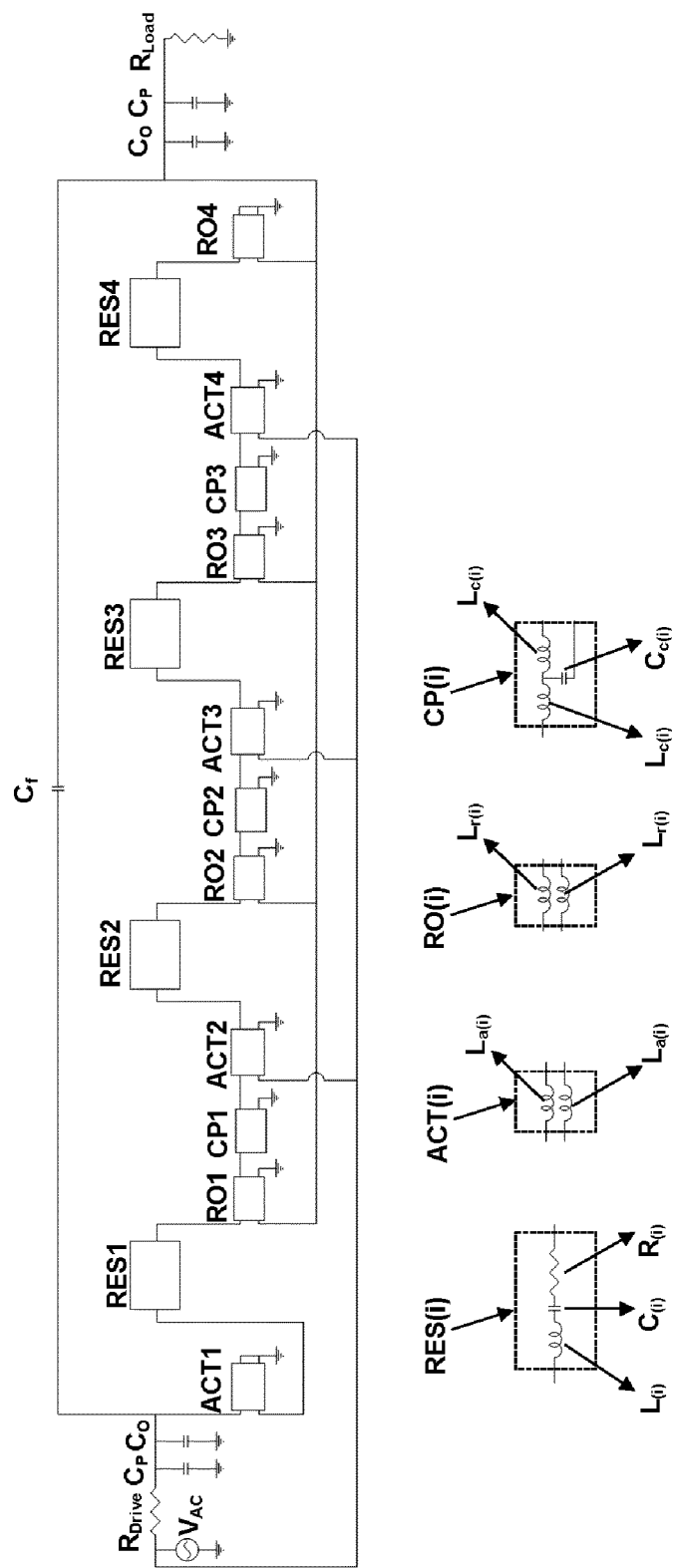
FIG. 6 is an equivalent circuit of the oscillator system, in which a nanomechanical resonator array is used.

In the right column of FIG. 5, modeling for the whole resonator array (1) comprised of n number of nanomechanical resonators (2) is depicted. For the coupled nanomechanical resonator array (1), mechanical coupling obtained through membranes (3) at both ends of the nanomechanical resonators (2) is modeled using an FEA Eigenfrequency analysis tool. After obtaining mechanical coupling through relatively thin membranes (3) leading to in-phase resonance of all involved nanomechanical resonators (2), resonant frequencies of the n modes are determined. Similar to conversion of nanomechanical resonator (2) to RLC electrical oscillator, mass and stiffness of the membrane (3) are modeled as inductors and capacitances, $L_c$ and $C_c$, respectively, which are in agreement with the impedance analogy. $L_c$ and $C_c$ in each coupling element are tuned to match n mechanical modes of the coupled nanowire resonators (2) in the resonator array (1). Increasing inductance corresponds to an increase in mass and increasing capacitance corresponds to a decrease in stiffness of the mechanical element. This way, frequencies of all n modes are matched and the electromechanical modeling of the coupled resonator array (1) is achieved. Subscript i refers to $i^{th}$ resonator (2) or $i^{th}$ coupling element in the resonator array (1). FIG. 6 shows the corresponding circuit for four (n=4) nanomechanical resonators (2). In FIG. 6 $C_p$ represents parasitic capacitance.

Figure 7:
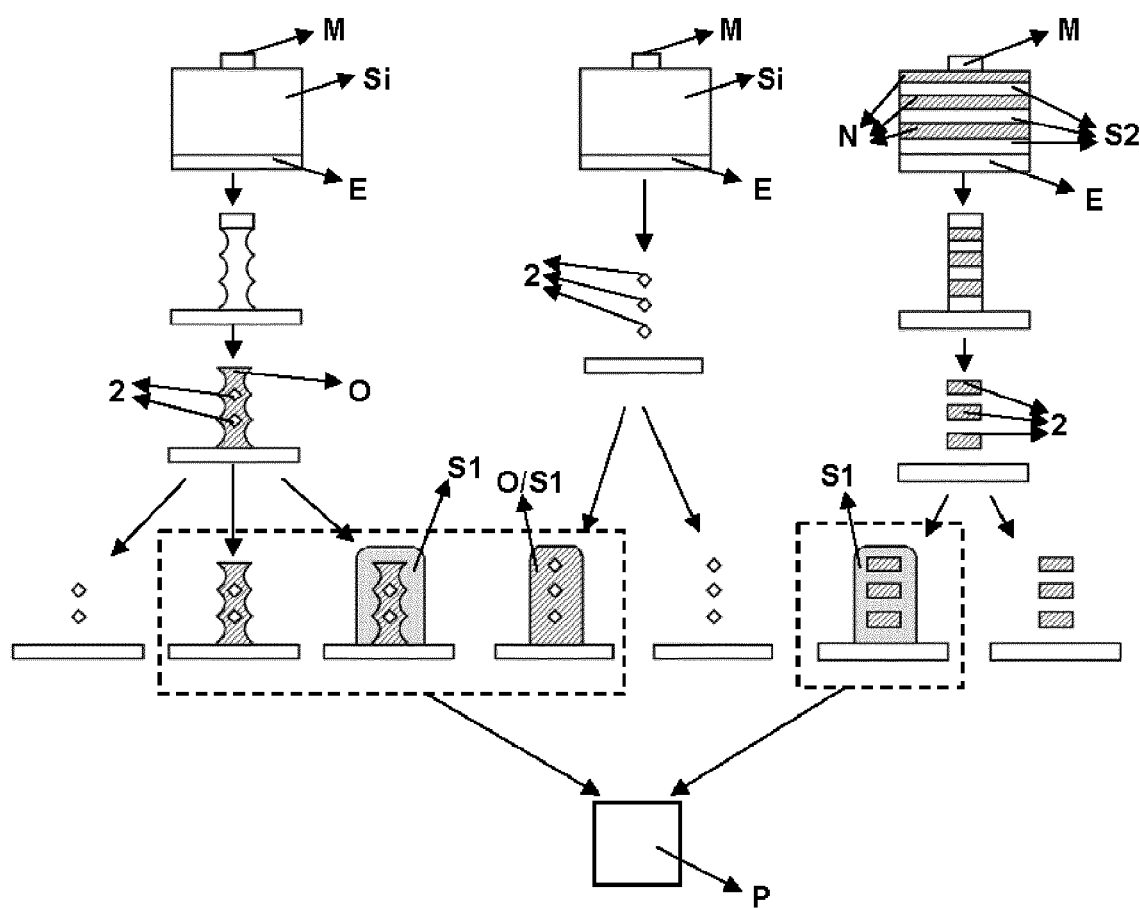
FIG. 7 is a fabrication process flow for silicon-based and non-silicon-based nanomechanical resonators.

FIG. 7 shows a production method of the oscillator array (1) of the present invention. Various methods can be used to obtain a vertical array of nanomechanical resonators. For a silicon-based approach (left column in FIG. 7) Bosch process is used to fabricate a stack of Si nanowires. Array fabrication is achieved through patterning two windows on device silicon layer exposing it to plasma etching. These windows should be close enough to facilitate meeting of etch scallops from both sides along the centerline of the dividing mask during the subsequent Bosch process. The number of nanowires is thus equal to the number of utilized etch cycles. The distance between nanowires is determined by the duration of the chemical etch step. Alternatively, one can keep the distance between two windows larger, where scallops will not completely etch through the dividing silicon column. A further oxidation process will then be carried out to form nanowires in an oxide envelop. Nanowires are then released by etching the oxide envelope. The parameters of the process also determine the nanowire diameter, shape of the cross-section and other geometrical parameters. In both cases (with narrow and wide mask) one can further oxidize silicon and then etch oxide to reduce the nanowire diameter further if necessary. An oxide or similar coating is also necessary to form a sacrificial and protective layer on the nanowire stack when the electrode material is deposited.

The membranes are obtained by having a wider etch mask prohibiting the scallops to destroy membrane's integrity by cutting through it, whereas the nanowire region is narrower to achieve array formation. This way the desired effective membrane thickness is achieved on the layout.

Figure 8:
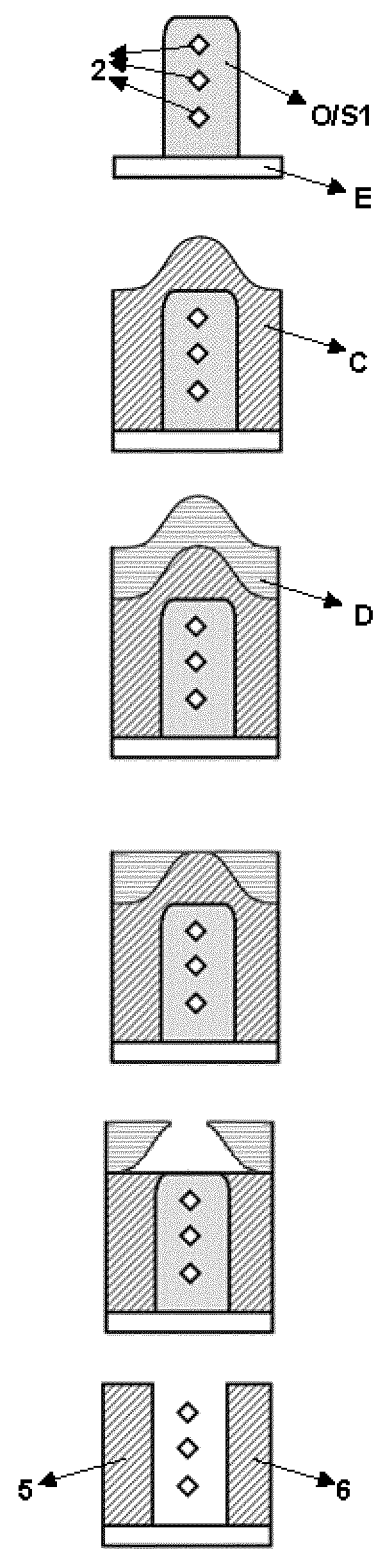
FIG. 8 is integration of nanomechanical resonators and metallic electrodes.

Array formation can be followed by electrode patterning (FIG. 8). The deposition of electrode material is followed by coating of a self-aligned mask material. This is followed by chemical-mechanical polishing and etching of the electrode material on top of the nanowire stack. Final stage is etching of sacrificial protective coating and/or oxide layer on the nanowire stack. This way a pair of electrodes is obtained. The distance between each electrode and resonator stack is equal to the thickness of the sacrificial protective coating and/or oxide layer.

For a non-silicon-based system (right column in FIG. 7) epitaxial or similar growth of two different materials (one structural and the other one sacrificial) in a sequential manner will provide a vertical array. Patterning a column through anisotropic etch followed by isotropic and selective etching of sacrificial material isolates nanomechanical resonators from each other in the form of an array. Proper fabrication of the actuation and detection electrodes will provide the same device scheme with the Si-based alternative as shown in FIG. 8. Second sacrificial material (S2) can be kept when first sacrificial material (S1) is deposited in FIG. 7 and removed during the final release step in FIG. 8 as well.

The invention claimed is:

1. A resonator array suitable for being used in an oscillator, said resonator array comprising;
    at least two resonators, which are in a size of nanometers and which are vertically arrayed;
    at least one coupling membrane, which mechanically couples said at least two resonators at an end of each of the at least two resonators; and
    at least one clamping element, which supports mechanical coupling of the at least two resonators by clamping said at least one coupling membrane.

2. The resonator array according to claim 1, wherein the at least two resonators of the resonator array are identical.

3. The resonator array according to claim 1, wherein at least two of the at least two resonators of the resonator array are non-identical.

4. An oscillator which comprises the resonator array according to claim 1, and an actuator for actuating said resonator array.

5. The oscillator according to claim 4, wherein said actuator is an actuating electrode.

6. The oscillator according to claim 4, wherein said actuator is a thermal actuator.

7. The oscillator according to claim 4, wherein said actuator is a magnetic actuator.

8. The oscillator according to claim 5, wherein said oscillator comprises an readout electrode for sensing motion of the resonator array.

9. The oscillator according to claim 5, wherein said oscillator further comprises an optical detector for sensing motion of the resonator array.

10. The oscillator according to claim 4, wherein at least two of the at least two resonator arrays have different frequency responses.

11. The oscillator according to claim 10, wherein said oscillator further comprises a frequency manipulation circuitry, wherein an output of each array is connected to said frequency manipulation circuitry.

12. A production method for the resonator array according to claim 1, said method comprising:
    patterning two windows on a device silicon layer and exposing the device silicon layer to plasma etching using a Bosch process;
    carrying out oxidation of the device silicon layer to form a plurality of nanowires in an oxide envelop beneath a wide mask;
    releasing the plurality of nanowires by etching the oxide envelope.

13. A production method for the oscillator according to claim 4, comprising:
    patterning two windows on a device silicon layer and exposing the device silicon layer to plasma etching using Bosch process;
    carrying out oxidation of the device silicon layer to form a plurality of nanowires in an oxide envelop beneath a wide mask;
    depositing an oxide to coat the plurality of nanowires;
    depositing an electrode material;
    depositing a self-aligned mask material;
    polishing the self-aligned mask material until the electrode material is exposed;
    etching the electrode material; and
    releasing the plurality of nanowires by etching the oxide envelope.

14. A production method for the resonator array according to claim 1, comprising:

forming a multilayer by depositing a plurality of sacrificial layers and a plurality of structural layer repeatedly and alternatingly on top of one of the plurality of sacrificial layers and one of the plurality of structural layers;
patterning the top surface of the multilayer;
anisotropically etching the multilayer; and
releasing a plurality of nanowires by removing the plurality of sacrificial layers by isotropic etching.

15. A production method for the oscillator disclosed in claim 4, comprising:
forming a multilayer by depositing a plurality of sacrificial layers and a plurality of structural layers repeatedly and alternatingly on top of one of the plurality of sacrificial layers and one of the plurality of structural layers;
patterning the top surface of the multilayer;
anisotropically etching the multilayer;
depositing a new sacrificial layer which conforms to a shape of the multilayer;
depositing an electrode material;
depositing a self-aligned mask material;
polishing the self-aligned mask material until the electrode material is exposed;
etching the electrode material; and
releasing a plurality of nanowires by removal of the plurality of sacrificial layers by isotropic etching.

16. A production method for the oscillator according to claim 4, comprising:
forming a multilayer by depositing a plurality of sacrificial layers and a plurality of structural layers repeatedly and alternatingly on top of one of the plurality of sacrificial layers and one of the plurality of structural layers;
patterning the top surface of the multilayer;
anisotropically etching the multilayer;
isotropically etching at least one of the plurality of sacrificial layers;
depositing a new sacrificial layer which conforms to a shape of the multilayer;
depositing an electrode material;
depositing a self-aligned mask material;
polishing the self-aligned mask material until the electrode material is exposed;
etching the electrode material; and
releasing a plurality of nanowires by removal of the plurality of sacrificial layers by isotropic etching.

* * * * *